United States Patent
Streete et al.

(10) Patent No.: US 11,349,339 B1
(45) Date of Patent: May 31, 2022

(54) USAGE-BASED COST STRUCTURING SYSTEM AND METHOD

(71) Applicant: VCE IP Holding Company LLC, Richardson, TX (US)

(72) Inventors: Jonathan Streete, San Jose, CA (US); Daniel J. Butzer, McKinney, TX (US)

(73) Assignee: EMC IP Holding Company LLC, Round Rock, TX (US)

( * ) Notice: Subject to any disclaimer, the term of this patent is extended or adjusted under 35 U.S.C. 154(b) by 874 days.

(21) Appl. No.: 15/499,209

(22) Filed: Apr. 27, 2017

(51) Int. Cl.
*G06Q 50/06* (2012.01)
*H02J 13/00* (2006.01)
*G05B 15/02* (2006.01)

(52) U.S. Cl.
CPC .......... *H02J 13/0062* (2013.01); *G05B 15/02* (2013.01); *G06Q 50/06* (2013.01)

(58) Field of Classification Search
CPC ................................. G06Q 50/06; G05B 15/02
USPC ......................................................... 705/412
See application file for complete search history.

(56) References Cited

U.S. PATENT DOCUMENTS

| 8,949,646 B1* | 2/2015 | Weber | G06F 1/3206 |
| | | | 713/340 |
| 9,891,682 B1* | 2/2018 | Czamara | G06F 1/266 |
| 10,033,220 B1* | 7/2018 | Nguyen | H02J 9/06 |
| 2009/0235097 A1* | 9/2009 | Hamilton | G06F 1/3203 |
| | | | 713/320 |
| 2009/0240964 A1* | 9/2009 | Pfeiffer | G06F 1/3209 |
| | | | 713/320 |
| 2009/0292654 A1* | 11/2009 | Katiyar | G06Q 50/06 |
| | | | 705/412 |
| 2011/0166959 A1* | 7/2011 | Winter | G06Q 10/04 |
| | | | 705/26.25 |
| 2012/0022815 A1* | 1/2012 | Murakami | G01D 4/002 |
| | | | 702/62 |
| 2013/0073882 A1* | 3/2013 | Inbaraj | G06F 1/3206 |
| | | | 713/320 |
| 2013/0246313 A1* | 9/2013 | Greene | G06Q 10/00 |
| | | | 705/412 |

(Continued)

FOREIGN PATENT DOCUMENTS

EP 3242185 A1 * 11/2017 ............... G06F 1/26

OTHER PUBLICATIONS

J. Yao, X. Liu, W. He and A. Rahman, "Dynamic Control of Electricity Cost with Power Demand Smoothing and Peak Shaving for Distributed Internet Data Centers," 2012 IEEE 32nd International Conference on Distributed Computing Systems, Jun. 1, 2012, pp. 416-424. (Year: 2012).*

*Primary Examiner* — Jeff Zimmerman
*Assistant Examiner* — Hunter A Molnar
(74) *Attorney, Agent, or Firm* — Polsinelli PC; Derek D. Donahoe

(57) ABSTRACT

A usage-based cost structuring system includes a computer-executable tool for obtaining, using a power monitor coupled to at least one of a plurality of equipment devices configured in a computing rack, ongoing power consumption measurements of the at least one equipment devices at ongoing intervals. Using the measurements, the instructions may estimate an energy consumption of the equipment device by combining the obtained power consumption measurements over a specified period of time, and determine a cost to be assessed to a user of the at least one equipment device according to the estimated energy consumption.

18 Claims, 5 Drawing Sheets

(56) References Cited

U.S. PATENT DOCUMENTS

| | | | |
|---|---|---|---|
| 2015/0167989 A1* | 6/2015 | Matsuoka | F24D 19/10 700/276 |
| 2016/0140274 A1* | 5/2016 | Wachs | H04L 9/003 703/2 |
| 2016/0252949 A1* | 9/2016 | Virolainen | G06F 11/3062 713/323 |
| 2017/0220092 A1* | 8/2017 | Kodama | G06F 1/3234 |

* cited by examiner

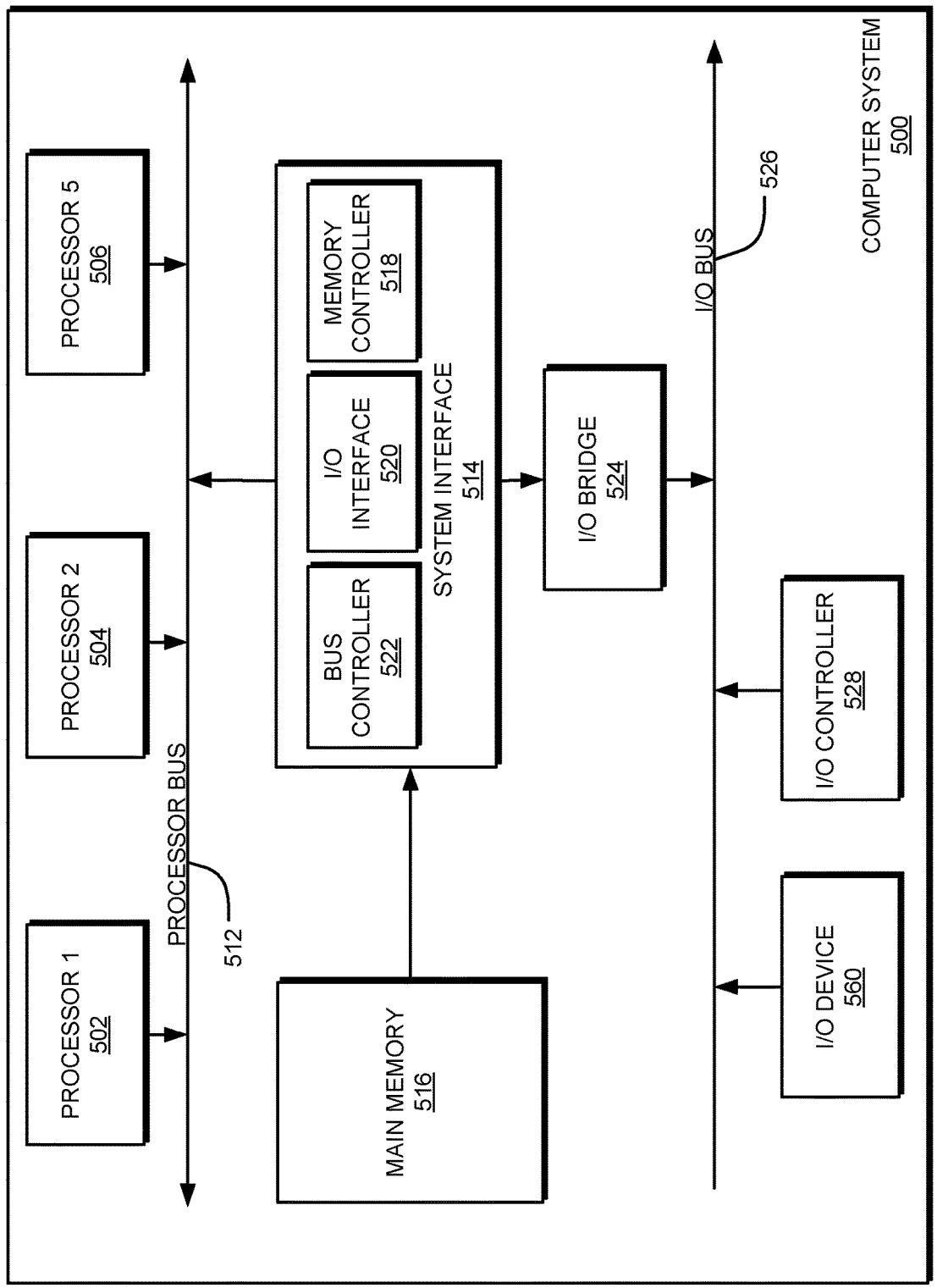

USAGE-BASED COST STRUCTURING SYSTEM AND METHOD

TECHNICAL FIELD

The present disclosure relates to computer network infrastructure, and more specifically to a usage-based cost structuring system and method.

BACKGROUND

Many large scale computing systems are implemented using distributed computing technologies, such as computer clusters, computer arrays, converged infrastructures, and hyper-converged infrastructures, where the computing systems use multiple equipment devices that function in a synergistic manner to support the overall processing load of the computing system. Computing systems such as these are often configured in computing racks that generally provide a standardized physical structure for housing and protecting the equipment devices used by the computing system.

Determining usage of these large scale computing systems can be a complicated and burdensome process. For example, many organizations will sell cloud based computing capacity to a business, where the business is billed in proportion to the perceived usage of the infrastructure. The formula for this perceived usage is often quite complex, and requires monitoring many devices and elements within the cloud computing infrastructure. For example, the monitoring can require running a software agent on each and every device being used, with the agents monitoring elements such as processor cycles, memory consumed, IOPS (Input/Output Operations Per Second), storage consumed, and network bandwidth/throughput. Making management decisions based on a formula with these factors can be challenging due to the complexity of the factors, as well as the difficulty of users to directly attribute the infrastructure costs with the business value obtained from such infrastructure.

SUMMARY

Disclosed are systems, methods, and non-transitory computer-readable storage media for real-time, power-based, determinations of network infrastructure usage. Systems configured according to this disclosure calculate usage (and by extension, usage costs) of network infrastructure based on the energy consumed by individual networking devices. Individual device energy consumption can be monitored either by individual power monitors connected to the networking devices, or by a "smart" power distribution unit which can record the power used by individual outlets. The system first determines a baseline power consumption while the various devices are idling, then repeatedly polls the power distribution unit (or energy monitors) to determine how much energy has been used. Using this information, the costs for using each device can be calculated and reported to users.

Consider the following exemplary system, configured according to this disclosure. The system first records a baseline power consumption of each device in a plurality of devices, the plurality of devices being associated with a power distribution unit, while the plurality of devices are in an idle state. After recording the baseline power consumption, the system iteratively polls the power distribution unit to identify an interval power consumption of each device in the plurality of devices, wherein each device in the plurality of devices is in one of the idle state and an operating state. The system then calculates, for each iteration, usage costs associated with individual devices in the plurality of devices using the baseline power consumption and the interval power consumption of each device in the plurality of devices. These usage costs can then be provided to users who can view, in real-time, the costs associated with each device, allowing the users to make decisions regarding which devices should be turned off, upgraded, etc.

This approach simplifies the requirements to determine infrastructure usage. More directly, the computing systems are improved by not requiring software agents to detect the various data required by more complex formulas, thereby reducing security risks associated with such monitoring agents as well as reducing computing requirements. In addition, this simplified system, by not getting lost in the details of data such as processor flops and bandwidth use, provides a more accurate system view than previously available. This approach also provides a power saving solution for large scale computing systems, allowing individual devices to be turned off based on respective usage costs, thereby reducing energy consumption.

BRIEF DESCRIPTION OF THE DRAWINGS

The various features and advantages of the technology of the present disclosure will be apparent from the following description of particular embodiments of those technologies, as illustrated in the accompanying drawings. It should be noted that the drawings are not necessarily to scale; however the emphasis instead is being placed on illustrating the principles of the technological concepts. Also, in the drawings the like reference characters refer to the same parts throughout the different views. The drawings depict only typical embodiments of the present disclosure and, therefore, are not to be considered limiting in scope.

FIG. 5 illustrates an example computer system according to one embodiment of the present disclosure.

DETAILED DESCRIPTION

Figure 1:
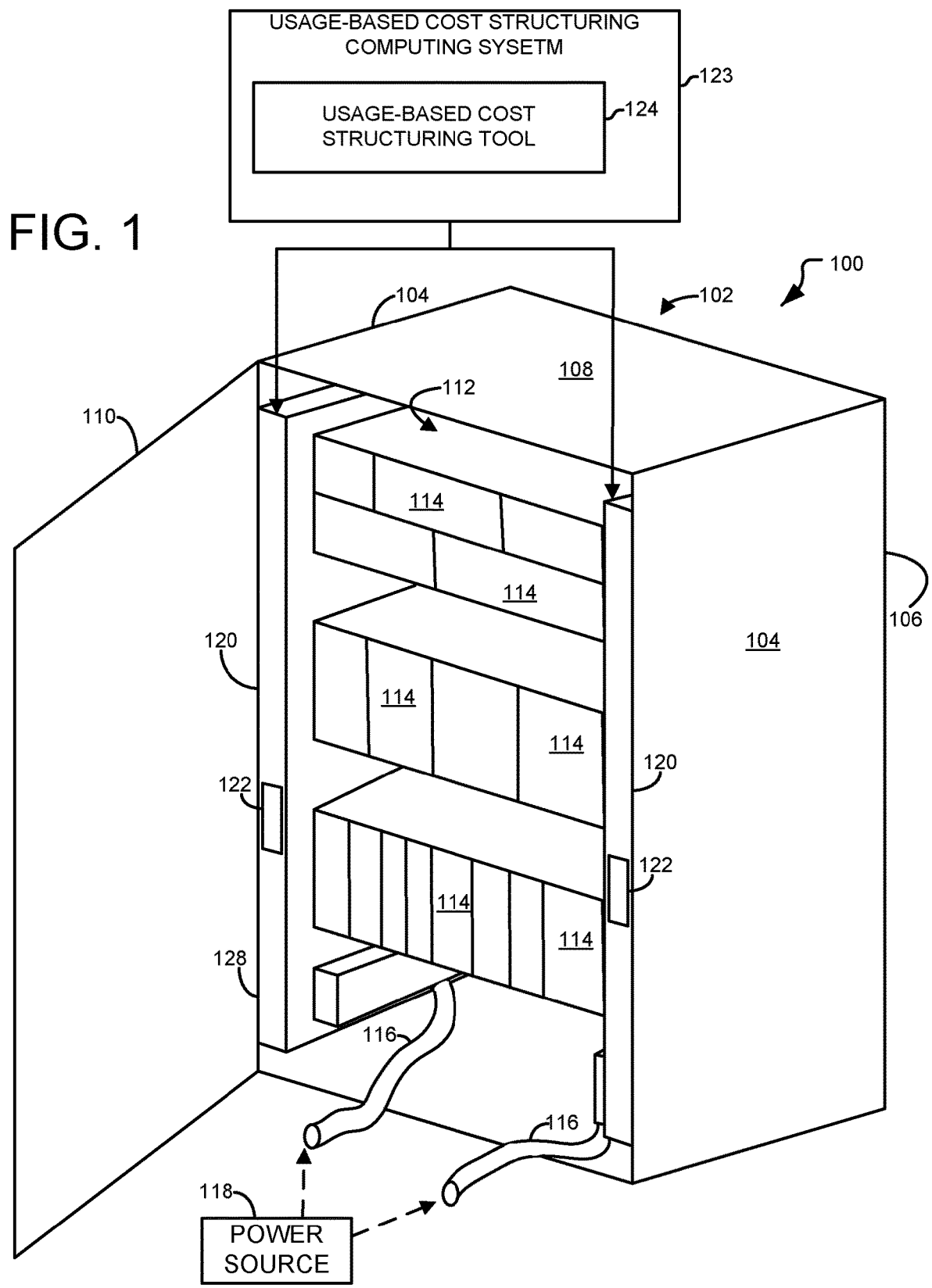
FIG. 1 illustrates an example usage-based cost structuring system according to one embodiment of the present disclosure.

Systems configured according to this disclosure calculate usage (and by extension, usage costs) of network infrastructure based on the energy consumed by individual networking devices. Consumption can be monitored either by individual power monitors connected to the networking devices, and/or by a "smart" power distribution unit which can record the power at individual outlets. In some cases, the system may first determine a baseline power consumption while the various devices are idle, then poll the power distribution unit or energy monitors to determine energy usage. Using this information, the costs for using each device can be calculated and reported to users.

According to one embodiment, the system first records a baseline power consumption of each device on a device level basis where the device is among other devices associated with a power distribution unit. Baseline power consumption may be obtained while the plurality of devices are in an idle state (e.g., powered on, but doing some known operations). After recording the baseline power consumption, the system polls the power distribution unit on an ongoing basis to identify an interval power consumption of each device. Polling may be done when the devices are in one of the idle state and an operating state. The system then calculates usage costs associated with individual devices in the devices using the baseline power consumption and the interval power consumption of each device over a specified period of time. These usage costs can then be provided to users who can view, in real-time, the costs associated with each device, allowing the users to make decisions regarding which devices should be turned off, upgraded, and the like.

This approach simplifies the requirements to determine infrastructure usage. More directly, the computing systems are improved by not requiring software agents to detect the various data required by more complex formulas, thereby reducing security risks associated with such monitoring agents as well as reducing computing requirements. In addition, this simplified system, by not getting lost in the details, such as processor flops and bandwidth use, provides a more optimal system view than previously available. This approach also provides a power saving solution for large scale computing systems, allowing individual devices to be turned off based on respective usage costs, thereby reducing energy consumption.

In addition, systems can be configured to turn off (or turn on) devices based on these power-based usage costs. For example, a system can be configured to turn off a device when the usage of that device results in an unjustified cost. In such an example, a company may determine that a server being used at only 1% of its respective capacity does not justify a cost of $5,000 per month (and therefore have the system automatically turn off the device), but might determine that a similar usage is justified at $100 per month (and therefore leave the device operating). In a similar example, because the usage costs calculated herein are based on power consumption, the determinations to turn off or on a device can be based on energy costs which vary by time of day or by season. Thus, a server may not be used enough to justify the cost during hours when energy costs are higher, but might be sufficiently used to justify the cost during times when energy costs are lower.

The system can prepare reports outlining the power consumption for user review, with costs attached to each device based on the power consumption. Such an approach simplifies the requirements to determine networking infrastructure usage by reducing the variables required to understand how network devices are being used and the respective cost of that use. This approach improves computing systems by not requiring software agents to detect the various data required by more complex formulas, thereby reducing the need for the software agents and freeing up processing resources while also reducing security risks associated with such monitoring agents.

The disclosure now turns to a discussion of the figures for additional description and details of these concepts.

FIG. 1 illustrates an example usage-based cost structuring system 100 according to one embodiment of the present disclosure. The system 100 includes a computing rack 102 (also known as a "server rack") having various equipment devices 114 connected to power distribution units 120, where the power distribution units 120 record energy consumption of the devices 114 within the rack 102 using one or more power monitors 122. Example devices can include servers, switches, routers, and patch panels. The computing rack 102 may include two sidewalls 104, a back wall 106, a top surface 108, and a door 110 covering the front entrance to define an enclosure 112; although the system may work with other devices regardless of the type of such system. The enclosure 112 is adapted for placement of multiple equipment devices 114, which may be for example, rack-mounted equipment devices of a converged (or hyper-converged) infrastructure.

The power distribution units 120 can be modular or non-modular, and provide electrical power to the equipment devices 114 from a corresponding one or more power cables 116 coupled to a suitable power source 118. According to embodiments of the present disclosure, the power distribution units 120 uniquely identifies each equipment device 114 that it is connected to and includes a power monitor 122 for measuring a power consumption experienced by each equipment device 114 and reports the measured power consumption value associated with each equipment device 114 to which it is connected for reasons that will be explained in detail herein below.

While only a single computer rack 102 is illustrated, the concepts disclosed herein can be extended to data centers with more than one computer rack 102. In other words, data centers and server farms can be configured to operate within the scope of this disclosure. Similarly, while a computer rack 102 is illustrated, the concepts disclosed herein extend to the use of devices without a computer rack 102, and even singular devices connected to a power distribution unit 120 or an energy consumption monitor.

According to embodiments of the present disclosure, a usage-based cost structuring computing system 123 stored in and executed by a usage-based cost structuring tool 124 is provided. The tool 124 records, using the power monitor 122 configured in the power distribution units 120, an interval power consumption measurement of each of the equipment devices at ongoing intervals, estimates an energy consumption of the equipment devices over a specified period of time by combining the recorded interval power consumption measurements over the specified period of time, and determines a cost to be assessed to a user of the equipment device according to the determined energy consumption.

The power monitor used to record the interval power consumption measurement may be embodied in any suitable form. In one embodiment, the power monitor may be configured in the power distribution unit(s) 120 used to power the equipment devices 114. In such an arrangement, the power distribution units 120 may obtain a unique identity of each equipment device 114 to which it is coupled and using one or more internally configured power monitors measure and record an interval power consumption measurement.

According to one embodiment, a baseline level of power consumption of each of the various devices 114 may take when the devices 114 are idle (e.g., the devices 114 are turned on but not being used). Because this baseline level of power consumption is completed on an individual device basis, the baseline power consumption levels can be recorded on an individual device basis, where only the device whose baseline energy consumption is being measured must be in an idle state. In other embodiments, all of the devices 114 within a computer rack 102 can be idling as the baseline measurements are taken.

The baseline measurements can be retained by the power distribution units 120, or can be communicated to the tool 124, which is configured (according to this disclosure) to receive usage data from the power distribution units 120 and calculate usage costs for each equipment device 114. The computing system 104 on which the tool 124 is executed can be one of the devices 114 within the computer rack 102, can be a device stored in a separate server rack, or can be any other device networked to the computer rack 102.

After the initial baseline measurements of the devices 114 are taken, the tool 124 polls the power distribution units 120 to determine power consumption during a predefined interval. For example, the tool 124 can poll the power distribution unit 120 every three seconds, or every five seconds over a month long period of time, and determine how much energy has been consumed by specific devices 114 during that period of time. The intervals can be predefined by a human user, or can be defined by a processor based on a number of power distribution units, a number devices being polled, and/or processing capacity by the collecting/polling central equipment device. Defining of the interval duration can occur during the polling, or can occur before polling begins. The usage data reported by the power distribution units 120 to the tool 124 can then be used, in conjunction with the baseline energy consumption data, to calculate the usage costs associated with the individual devices 114 in the computer rack 102.

Figure 2:
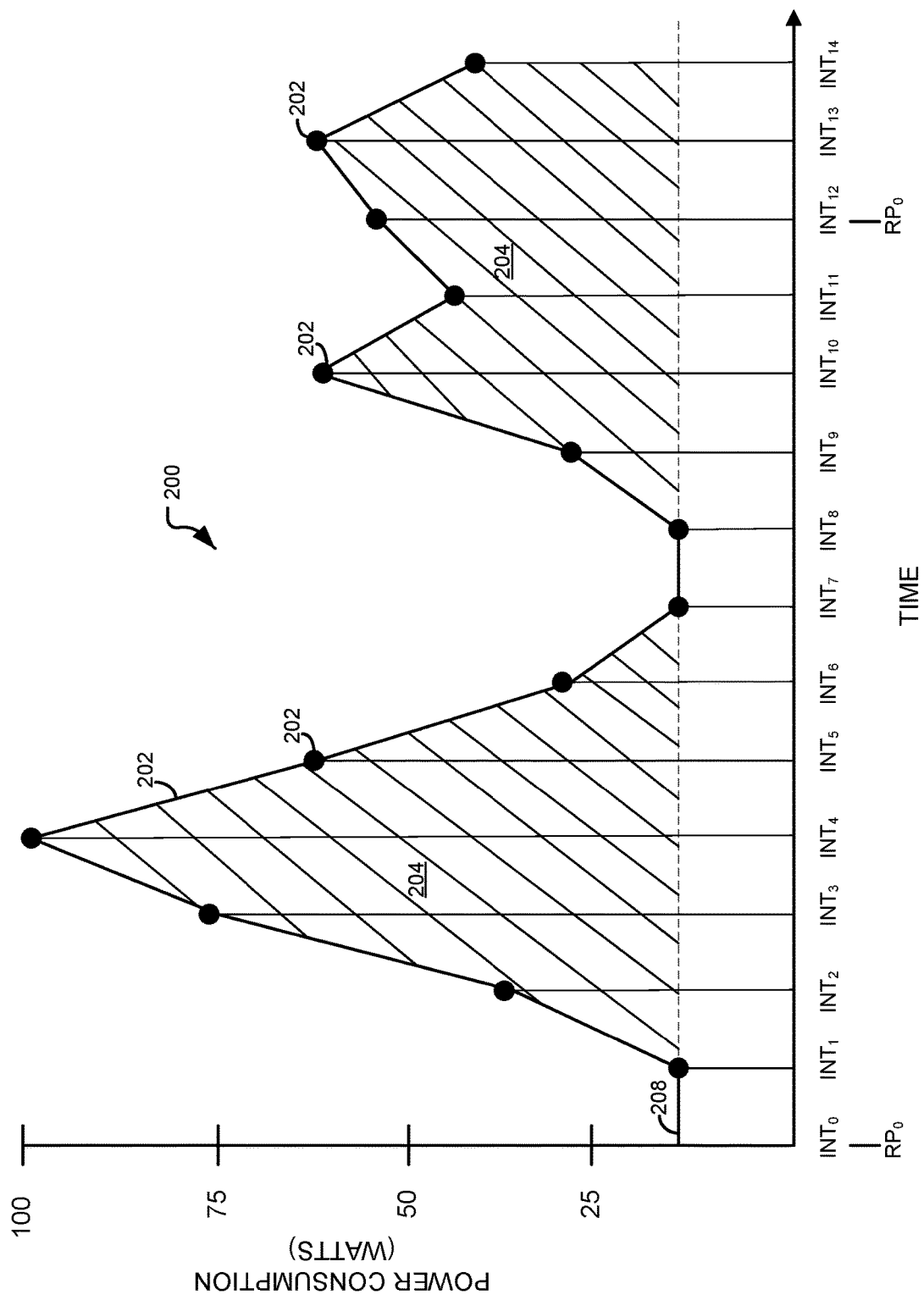
FIG. 2 illustrates an example graph showing how the tool may estimate power consumption according to one embodiment of the present disclosure.

FIG. 2 illustrates an example graph 200 showing how the tool 124 may estimate power consumption according to one embodiment of the present disclosure. At ongoing intervals (INT), the tool 124 communicates with the power distribution units 120 to obtain power consumption measurements 202. Further, the tool 124 estimates an energy consumption at ongoing reporting periods (RPs). For example, at reporting period RP1, the tool 124 combines the power consumption values obtained at intervals (INT0 to INT12) to form an estimated value of the energy consumed by the equipment device 114 during that reporting period. The tool 124 may estimate the energy consumption in any suitable manner. In one embodiment, the tool 124 may estimate the energy consumed by the equipment device 114 by summing the obtained power consumption measurements 202. In another embodiment, the tool 124 may generate a waveform 204 from the measurements 202 and estimate the energy consumed by the equipment device 114 by performing an integral function to determine the area 206 beneath the waveform 204 as shown by the cross-hatched region in the graph 200. As shown, the area 206 beneath the waveform 204 is limited to the region above a baseline power consumption measurement 208. In other embodiments, the tool 124 may estimate the energy consumed by the equipment device 114 by including the region beneath the baseline power consumption measurement 208 if an estimation of absolute energy consumption is desired. It is considered an estimate because the measured energy usage approximates the amount of processing provided by the equipment device 114, as opposed to direct measurement of the amount of processing being performed.

Although the present example graph shows a maximum wattage value of 100 Watts, it should be understood that the maximum power used by an equipment device 114 may be any value, such as greater than 100 Watts or less than 100 Watts. Additionally, although the graph shows that the tool 124 acquires 12 power consumption measurements during each reporting period, it should be understood that the tool 124 may acquire any quantity of power consumption measurements during a reporting period.

The tool 124 and the power distribution units 120 communicate with one another using a communications network. Nevertheless, the tool 124 and the power distribution units 120 may communicate with one another in any suitable manner. For example, the tool 124 and the power distribution units 120 may communicate with each other using wireless, wired, and/or optical communications. In one specific embodiment, the tool 124 and the power distribution units 120 communicates with one another using a communication network, such as the Internet, an intranet, or other wired and/or wireless communication networks. In another embodiment, the tool 124 and the power distribution units 120 communicate using any suitable protocol or messaging scheme. For example, these networks may communicate using a Hypertext Transfer Protocol (HTTP), extensible markup language (XML), extensible hypertext markup language (XHTML), or a Wireless Application Protocol (WAP) protocol. Other examples of communication protocols exist. For example, the systems may communicate without the use of a separate or a distinct network. Additionally, other embodiments contemplate that the modules employed by the tool 124 are executed by an equipment device 114 configured on the computing rack 102.

Figure 3:
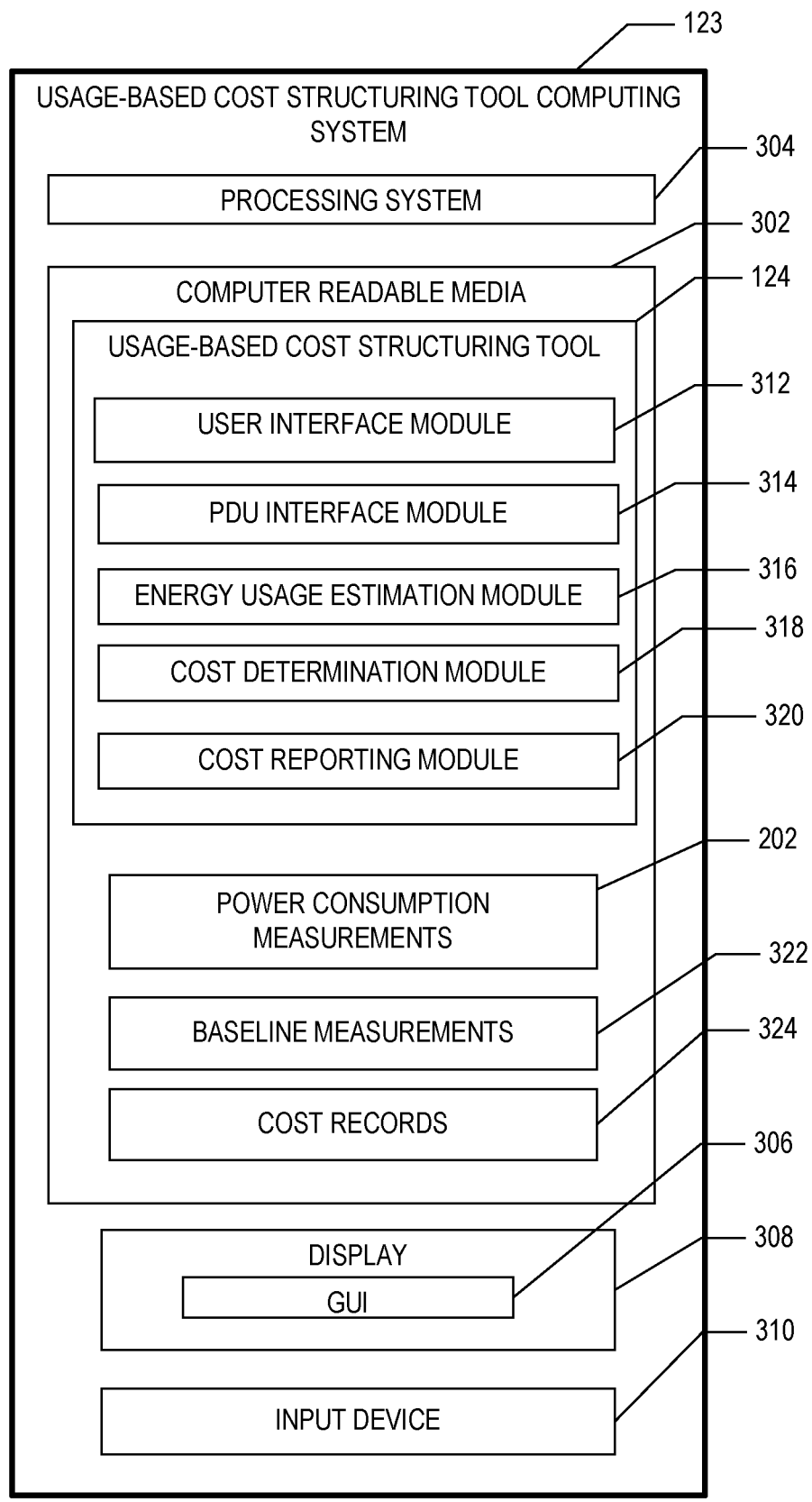
FIG. 3 illustrates a block diagram of an example usage-based cost structuring tool executed on the transaction analysis tool computing system according to one embodiment of the present disclosure.

Referring now in more detail to FIG. 3, a block diagram of an example tool 124 executed on the computing system 123, is depicted according to one aspect of the present disclosure. The tool 124 is stored in a memory 302 (e.g., computer readable media) and executed on a processing system 304 (e.g., computing unit) of the management computing system 102. The management computing system 102 may include any type of computing system, such as one or more management computing systems, personal computers, mobile computers and/or other mobile devices, and/or other hosts.

According to one aspect, the transaction analysis tool computing system 102 also includes a graphical user interface (GUI) 306 displayed on the display 308, such as a computer monitor, for displaying data. The transaction analysis tool computing system 102 also includes an input device 310, such as a keyboard or a pointing device (e.g., a mouse, trackball, pen, or touch screen) to enter data into or interact with the GUI 306. According to one aspect, the transaction analysis tool 124 includes instructions or modules that are executable by the processing system 302 as will be described in detail herein below.

The memory 302 includes volatile media, nonvolatile media, removable media, non-removable media, and/or another available medium. By way of example and not limitation, non-transitory computer readable medium comprises computer storage media, such as non-transient storage memory, volatile media, nonvolatile media, removable media, and/or non-removable media implemented in a method or technology for storage of information, such as computer readable instructions, data structures, program modules, or other data.

A user interface module 312 facilitates the receipt of input data and/or output data from or to a user. In one example, the user interface module 312 may receive user input, such as information associated with a cost rate to be established for certain types of equipment devices 114. For example, a communication-based device may be established with a cost rate of $0.25 per watt-hour of usage, while a computationally-based device such as a workstation may be established with a cost rate of $0.45 per watt-hour of usage. As another example, the user interface module 312 may receive user input for receiving information associated with a time interval that each measurement is to be taken and/or a period of time in which the costs for each equipment device 114 is to be assessed.

A power distribution unit interface module 314 provides an interface for communicating with the power distribution units 120 configured in the computing rack 102. For example, each power distribution unit 120 may include a processing device that exposes one or more application program interfaces (APIs) that may be accessed by the power distribution unit interface module 314 for receiving power consumption measurements as the measurements are taken or after a number of power consumption measurements are taken (e.g., at the end of the specified period of time). The power distribution unit interface module 314 may also receive status information from the power distribution units 120 for monitoring various operational aspects, such as configuration, operational status, system alarm conditions, and the like. In one embodiment, the power distribution unit interface module 314 may communicate with, and control the operation of the power distribution units 120 for various reasons, including instructing the power distribution units 120 start or stop taking power consumption measurements, instructions to perform a calibration procedure of the power distribution unit's internal power monitors, instructions to report any or all of the equipment devices 114 to which the power distribution unit 120 is coupled, and the like.

An energy usage estimation module 316 receives power consumption measurements from the power distribution unit 120 and estimates an energy consumption used by each equipment device 114 over an extended period of time. For example, the energy usage estimation module 316 may accumulate multiple power consumption measurements indicating an instantaneous power usage event at ongoing (e.g., periodic) intervals and combine those power consumption measurements to derive an estimation of how much cumulative energy has been used over the extended period of time. In one embodiment, the energy usage estimation module 316 may combine the power consumption measurements by summing their individual values to derive the energy consumption used by the equipment device 114. In another embodiment, the energy usage estimation module 316 may adjust the derived energy consumption value according to a baseline power consumption measurement taken while the equipment device 114 was in an idle (e.g., quiescent) state. In a particular embodiment, the energy usage estimation module 316 may adjust the derived energy consumption value by subtracting the obtained baseline power consumption measurement from the derived energy consumption value.

A cost determination module 318 determines a cost for use of the equipment device 114 over an established period of time (e.g., a reporting period). For example, the cost determination module 318 may receive an energy consumption of an equipment device 114 and determine a cost to be assessed to a user of the equipment device 114 based upon a cost rate. For a more particular example, the cost determination module 318, upon receipt of a derived energy consumption value from the energy usage estimation module 316, may identify a type of equipment device 114 (e.g., compute device, storage device, networking device, etc.), and apply a cost rate based upon the type of device.

A cost reporting module 320 generates a report of a cost to be incurred by a user based upon the estimated usage of the equipment device 114. In one embodiment, the cost usage reporting module 320 may transmit the determined energy consumption value to another equipment device, such as the equipment device 114 for which energy consumption values are determined, so that the user of the equipment device 114 may be informed about the usage of the equipment device 114. For example, the cost reporting module 320 may communicate with an agent loaded on and executed on the equipment device 114 to receive power consumption measurements and/or energy consumption values derived from the power consumption measurements, and display these measurements for view by the user of the equipment device 114. In such a case, the user may continually be made aware of how much the equipment device 114 is being used as well as how much benefit is provided via the use (e.g., lease) of the equipment device 114.

In another embodiment, the cost usage reporting module 320 may combine the energy consumption values from multiple equipment devices 114 leased by the user to derive a cumulative energy consumption value that can be reported to the user. In many cases, a user (e.g., tenant) may lease multiple equipment devices 114 from which to execute a distributed service or application. Therefore, the cumulative energy consumption value may be useful to report how much usage is incurred by the combined equipment devices 114 to execute the distributed service, as well as how much cost is incurred via the execution of the distributed service on the multiple equipment devices 114.

The computer readable media 302 may also store consumption measurements 202, baseline measurements 322, and cost reports 324 for each device 114 in the rack 102. When power consumption measurements 202 are reported by the power distribution units 120, the tool 124 can store these values for future processing. The baseline power measurements 322 can be stored for future determination of the cost to be assessed for the use of the device 114 by the user. Additionally, the cost reports 324 can include information describing how the device's costs are calculated. Such a report 324 can also indicate potential cost savings if the device were to be turned off. For example, the cost report 324 can indicate a certain server, if shut off, would save a certain amount of money per month, per day, or per hour, if shut off. In addition, the report 324 can indicate other cost related figures, such as times of day in which it would be cost efficient to reduce the number of active resources (based, for example, on energy cost and demand for the resources), or ways to consolidate the devices to reduce costs.

It should be appreciated that the modules described herein are provided only as examples, and that the tool 124 may have different modules, additional modules, or fewer modules than those described herein. For example, one or more modules as described in FIG. 3 may be combined into a single module. As another example, certain modules described herein may be encoded on, and executed on other computing environments, such as on one of the equipment devices 114 as described above with reference to FIG. 1.

Figure 4:
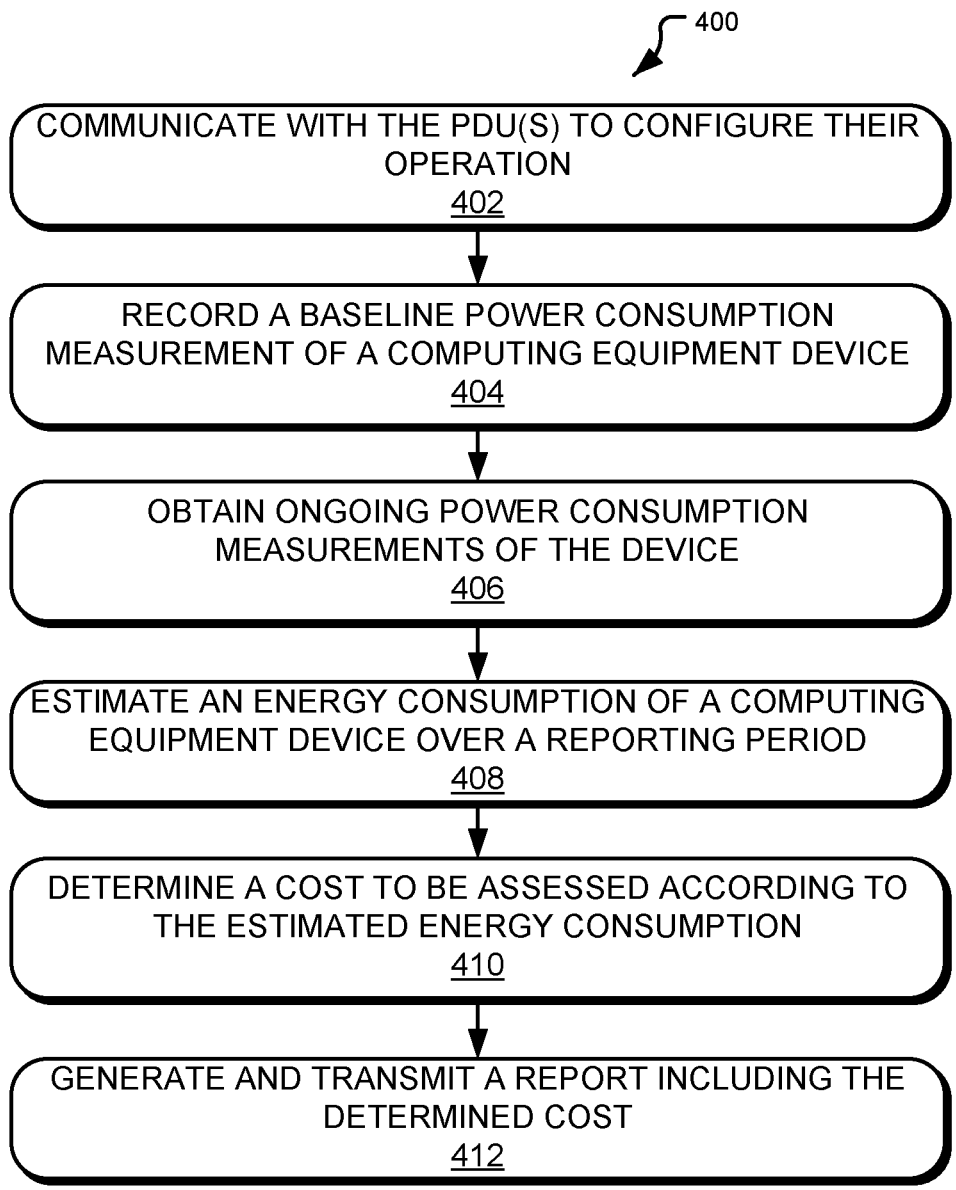
FIG. 4 illustrates an example process which can be performed by the tool to determine a cost for use of an equipment device based upon its energy usage according to one embodiment of the present disclosure.

FIG. 4 illustrates an example process which can be performed by the tool 124 to determine a cost for use of an equipment device 114 based upon its energy usage according to one embodiment of the present disclosure. Although the process herein below is described in terms of a single equipment device 114 for purposes of brevity and clarity of discussion, it should be understood that the tool 124 may simultaneously determine the costs for some, most, or all equipment devices 114 configured in the computing rack 102 without departing from the spirit and scope of the present disclosure.

Initially at step 402, the tool 124 communicates with the power distribution unit 120 to configure its operation. For example, the tool 124 may transmit certain parameters (e.g., time intervals for each measurement, how often the power distribution unit 120 is to transmit the power measurements to the tool 124, etc.) to be used by the power distribution unit 120 for obtaining and transmitting the obtained power measurements to the tool 124.

As another example, the tool 124 may communicate with the power distribution unit 120 to uniquely associate a particular equipment device 114 to be monitored and identify a power monitor that is to measure the power consumption of that equipment device 114. Most power distribution units 120 will often provide power to multiple equipment devices 114. Thus, to ensure that the measured power consumption values are obtained from the appropriate device, the power distribution unit 120 may receive unique identifying information (e.g., a serial number) of the equipment device 114 to be monitored, and configure its internal power monitor to measure the power consumption experienced on that equipment device 114.

At step 404, the tool 124 may optionally record a baseline power consumption measurement when the equipment device 114 is in an idle (e.g., quiescent) state. The baseline power consumption measurement may be used to adjust the energy consumption value derived by the tool 124 to obtain a relatively more accurate estimation of how much useful work was performed by the equipment device 114. That is, by obtaining the baseline power consumption measurement, an actual usage level may be estimated for the equipment device 114 by removing any residual power consumption experienced by the equipment device 114 that may not contribute significantly to its execution of any useful functionality. Nevertheless, recording the baseline power consumption measurement may be omitted if not needed or desired. For example, recording the baseline power consumption measurement may be omitted if a cost model established for the equipment device 114 includes its absolute, entire energy usage rather than how much work is performed on the equipment device 114.

At step 406, as the equipment device 114 is being used (e.g., incurring load due to its usage), the tool 124 obtains ongoing power consumption measurements at a continual, ongoing (e.g., periodic) basis. In one embodiment, the tool 124 may transmit a request message to the power distribution unit 120 each time a power consumption measurement is to be received and processed. In another embodiment, the power distribution unit 120 may automatically transmit power consumption measurements to the tool 124. In such a case, the tool 124 may transmit instructions for programming the power distribution unit 120 to automatically transmit power consumption measurements. For example, the tool 124 may program the power distribution unit 120 to immediately transmit the power consumption measurements as they are obtained, transmit a group of power consumption measurements after every specified quantity of measurements have been taken (e.g., after 10 measurements have been taken), or transmit a group of power consumption measurements after a specified period of time (e.g., each day, each week, etc.).

At step 408, the tool 124 estimates an energy consumption of the equipment device 114 based upon the power consumption measurements over a specified period of time. In one embodiment, the tool 124 may estimate the energy consumed by the equipment device 114 by summing the obtained power consumption measurements 202. In another embodiment, the tool 124 may estimate the energy consumed by the equipment device 114 by performing an integral function, in which the integral function defines an amount of energy consumed by the equipment device 114 over the reporting period.

At step 410, the tool 124 determines a cost to be assessed to a user (e.g., a tenant) of the equipment device 114 according to the estimated energy consumption. In one embodiment, the cost may be determined as a linear function of the energy used by the equipment device 114. For example, the tool 124 may assess a cost for the use of the equipment device 114 according to a rate schedule of $0.35 for each Watt-Hour of usage. In other embodiments, the cost may be determined according to any suitable model based upon various factors, such as customer expectations and/or marketing strategies of the provider.

At step 412, the tool 124 generates a report that includes the determined cost information and transmits the generated report to an authorized entity, such as the user. In one embodiment, the tool 124 may further process the estimated energy consumption to determine other factors, such as suggested changes to how the user uses the equipment device 114 so that future energy consumption can be reduced. Additionally, the tool 124 may further process the estimated energy consumption to show how usage of the equipment device 114 has changed over multiple reporting cycles.

The central device can also compile usage costs based on data aggregated from multiple iterations of polling. For example, the central device can store the usage costs and/or associated data in a database. The central device can then retrieve the stored data from the database and process it to determine usage costs over longer time intervals. This information can also be used to compile reports for an end-user, where the reports provide possible cost savings if the user were to reconfigure the plurality of devices 114. For example, the report may include possible savings if a specific device were shut down, or if certain devices only operated during specific hours. These possible savings can be calculated using information such as dynamic energy rates within a city (such as day rates versus night rates), and/or seasonal energy costs.

The use of the tool 124 may be continued to process ongoing power consumption measurements for ongoing reporting periods of the equipment device 114 as well as to process power consumption measurements for other equipment devices 114 in the computing rack 102. Nevertheless, when use of the tool 124 is no longer needed or desired, the process ends.

Although FIG. 5 describes one example of a process that may be performed by the system for providing a usage-based cost structure for the use of equipment devices 114, the features of the disclosed process may be embodied in other specific forms without deviating from the spirit and scope of the present disclosure. For example, the system 100 may perform additional, fewer, or different operations than those operations as described in the present example. As another example, the steps of the process described herein may be performed by a computing system other than the computing system 102, which may be, for example, one of the equipment devices 114 configured inside of the computing rack 102.

The description above includes example systems, methods, techniques, instruction sequences, and/or computer program products that embody techniques of the present disclosure. However, it is understood that the described disclosure may be practiced without these specific details.

In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form (e.g., software, processing application) readable by a machine (e.g., a computer). The machine-readable medium may include, but is not limited to, magnetic storage medium (e.g., hard disk drive), optical storage medium (e.g., CD-ROM); magneto-optical storage medium, read only memory (ROM); random access memory (RAM); erasable programmable memory (e.g., EPROM and EEPROM); flash memory; or other types of medium suitable for storing electronic instructions.

For example, FIG. 5 is a block diagram illustrating an example of a host or computer system 500 which may be used in implementing the embodiments of the present disclosure. The computer system (system) includes one or more processors 502-506. Processors 502-506 may include one or more internal levels of cache (not shown) and a bus controller or bus interface unit to direct interaction with the processor bus 512. Processor bus 512, also known as the host bus or the front side bus, may be used to couple the processors 502-506 with the system interface 514. System interface 514 may be connected to the processor bus 512 to interface other components of the system 500 with the processor bus 512. For example, system interface 514 may include a memory controller 513 for interfacing a main memory 516 with the processor bus 512. The main memory 516 typically includes one or more memory cards and a control circuit (not shown). System interface 514 may also include an input/output (I/O) interface 520 to interface one or more I/O bridges or I/O devices with the processor bus 512. One or more I/O controllers and/or I/O devices may be connected with the I/O bus 526, such as I/O controller 528 and I/O device 530, as illustrated.

I/O device 530 may also include an input device (not shown), such as an alphanumeric input device, including alphanumeric and other keys for communicating information and/or command selections to the processors 502-506. Another type of user input device includes cursor control, such as a mouse, a trackball, or cursor direction keys for communicating direction information and command selections to the processors 502-506 and for controlling cursor movement on the display device.

System 500 may include a dynamic storage device, referred to as main memory 516, or a random access memory (RAM) or other computer-readable devices coupled to the processor bus 512 for storing information and instructions to be executed by the processors 502-506. Main memory 516 also may be used for storing temporary variables or other intermediate information during execution of instructions by the processors 502-506. System 500 may include a read only memory (ROM) and/or other static storage device coupled to the processor bus 512 for storing static information and instructions for the processors 502-506. The system set forth in FIG. 5 is but one possible example of a computer system that may employ or be configured in accordance with aspects of the present disclosure.

According to one embodiment, the above techniques may be performed by computer system 500 in response to processor 504 executing one or more sequences of one or more instructions contained in main memory 516. These instructions may be read into main memory 516 from another machine-readable medium, such as a storage device. Execution of the sequences of instructions contained in main memory 516 may cause processors 502-506 to perform the process steps described herein. In alternative embodiments, circuitry may be used in place of or in combination with the software instructions. Thus, embodiments of the present disclosure may include both hardware and software components.

A machine readable medium includes any mechanism for storing or transmitting information in a form (e.g., software, processing application) readable by a machine (e.g., a computer). Such media may take the form of, but is not limited to, non-volatile media and volatile media. Non-volatile media includes optical or magnetic disks. Volatile media includes dynamic memory, such as main memory 516. Common forms of machine-readable medium may include, but is not limited to, magnetic storage medium (e.g., hard disk drive); optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions.

Embodiments of the present disclosure include various operations or steps, which are described in this specification. The steps may be performed by hardware components or may be embodied in machine-executable instructions, which may be used to cause a general-purpose or special-purpose processor programmed with the instructions to perform the steps. Alternatively, the steps may be performed by a combination of hardware, software and/or firmware.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A system comprising:
   a computing rack comprising an enclosure housing a plurality of equipment devices; and a power distribution unit enclosed within the housing of the computing rack, the power distribution unit in electrical communication with the plurality of equipment devices configured in the enclosure of the computing rack and distributing power from a common power source to the plurality of equipment devices, the power distribution unit comprising:

a power monitor coupled to at least one of the plurality of equipment devices configured in the computing rack to obtain ongoing power consumption measurements of the least one of the plurality of equipment devices at ongoing intervals, a duration of each of the ongoing intervals based on a total number of the plurality of equipment devices enclosed within the computing rack in electrical communication with and receiving power from the power distribution unit; and at least one processing unit and at least one non-transitory memory to store executable instructions that are executed by the at least one processing unit to:

estimate an energy consumption of the at least one of the plurality of equipment devices by summing the obtained ongoing power consumption measurements over a specified period of time, the period of time comprising a plurality of the ongoing intervals for measurements;

provide, to a receiving device, a cost to be assessed to a user of the at least one of the plurality of equipment devices according to the estimated energy consumption; and turn off, based on the cost to be assessed as compared to a threshold cost, a type of the at least one of the plurality of equipment devices, and a time of day, power to the at least one of the plurality of equipment devices.

2. The system of claim 1, wherein the executable instructions are further executed to:

obtain a baseline power consumption measurement of the equipment device when the equipment device is idle; and estimate the energy consumption by adjusting the obtained ongoing power consumption measurements according to the baseline power consumption measurement.

3. The system of claim 2, wherein the executable instructions are further executed to estimate the energy consumption by subtracting the baseline power consumption measurement from the obtained ongoing power consumption measurements.

4. The system of claim 1, wherein the executable instructions are further executed to estimate the energy consumption by generating a waveform from the obtained ongoing power consumption measurements over the specified period of time, and applying an integral function to the waveform.

5. The system of claim 1, wherein, wherein the executable instructions are further executed to:

uniquely identify the equipment device from other equipment devices of the plurality of equipment devices in the computing rack.

6. The system of claim 1, wherein the executable instructions are further executed to determine the cost according to a type of the equipment device.

7. The system of claim 1, wherein the executable instructions are further executed to transmit a message including the provided cost to an agent executed on the equipment device, the agent displaying the provided cost for view by the user.

8. A method comprising:

using a power distribution unit of a computing rack comprising an enclosure housing a plurality of equipment devices and the power distribution unit to distribute power from a common power source to the plurality of equipment devices, the power distribution unit comprising a power monitor to obtain a plurality of ongoing power consumption measurements of at least one equipment device of the plurality of equipment devices at ongoing intervals coupled to the plurality of equipment devices enclosed within the computing rack, a duration of each of the ongoing intervals based on a total number of the plurality of equipment devices enclosed within the computing rack in electrical communication with and receiving power from the power distribution unit;

estimating, using executable instructions stored in a non-transitory storage medium and executed on at least one processor, an energy consumption of the at least one equipment device by summing the plurality of obtained ongoing power consumption measurements over a specified period of time, the period of time comprising a plurality of the ongoing intervals for measurements;

providing, to a receiving device and using the executable instructions, a cost to be assessed to a user of the at least one equipment device according to the estimated energy consumption; and turning off, based on the cost to be assessed as compared to a threshold cost, a type of the at least one of the plurality of equipment devices, and a time of day, power to the at least one equipment device of the plurality of equipment devices.

9. The method of claim 8, further comprising:

obtaining a baseline power consumption measurement of the at least one equipment device when the at least one equipment device is idle; and estimating the energy consumption by adjusting the plurality of obtained ongoing power consumption measurements according to the baseline power consumption measurement.

10. The method of claim 9, further comprising estimating the energy consumption by subtracting the baseline power consumption measurement from the plurality of obtained ongoing power consumption measurements.

11. The method of claim 8, further comprising estimating the energy consumption by generating a waveform from the plurality of obtained power consumption measurements over the specified period of time, and applying an integral function to the waveform.

12. The method of claim 8, further comprising uniquely identifying, by the power distribution unit, the at least one equipment device from the plurality of equipment devices in the computing rack.

13. The method of claim 8, further comprising determining the cost according to a type of the at least one equipment device.

14. The method of claim 8, further comprising transmitting a message including the provided cost to an agent executed on the at least one equipment device, the agent displaying the provided cost for view by the user.

15. A non-transitory, computer readable medium comprising code that when executed by at least one processor, is operable to perform at least the following:

using a power monitor of a power distribution unit in electrical communication with a plurality of equipment devices of a computing rack comprising an enclosure housing a plurality of equipment devices and the power distribution unit, the power distribution rack distributing power to the plurality of equipment devices enclosed within the computing rack and from a common power source, the power monitor to obtain a plurality of power consumption measurements of an equipment device of the plurality of equipment devices at ongoing intervals configured in the computing rack, a duration of each of the ongoing intervals based on a total number of the plurality of equipment devices enclosed within the computing rack in electrical communication with and receiving power from the power distribution unit;

estimating an energy consumption of the equipment device by summing the obtained plurality of power consumption measurements over a specified period of time, the period of time comprising a plurality of the ongoing intervals for measurements;

providing, to a receiving device, a cost to be assessed to a user of the equipment device according to the estimated energy consumption; and turning off, based on the cost to be assessed as compared to a threshold cost, a type of the at least one of the plurality of equipment devices, and a time of day, power to the equipment device of the plurality of equipment devices.

16. The non-transitory, computer readable medium of claim 15, further operable to perform:

obtaining a baseline power consumption measurement of the equipment device when the equipment device is idle; and estimating the energy consumption by adjusting the obtained plurality of power consumption measurements according to the baseline power consumption measurement.

17. The non-transitory, computer readable medium of claim 16, further operable to perform estimating the energy consumption by subtracting the baseline power consumption measurement from the obtained plurality of power consumption measurements.

18. The non-transitory, computer readable medium of claim 15, further operable to perform uniquely identifying, by the power distribution rack, the equipment device from the plurality of equipment devices in the computing rack.

* * * * *